(12) United States Patent
Hirota et al.

(10) Patent No.: US 9,059,676 B2
(45) Date of Patent: Jun. 16, 2015

(54) SURFACE ACOUSTIC WAVE DEVICE AND ELECTRONIC COMPONENT

(71) Applicant: NIHON DEMPA KOGYO CO., LTD., Tokyo (JP)

(72) Inventors: Kazuhiro Hirota, Saitama (JP); Atsushi Mori, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 299 days.

(21) Appl. No.: 13/651,461

(22) Filed: Oct. 14, 2012

(65) Prior Publication Data

US 2013/0093538 A1 Apr. 18, 2013

(30) Foreign Application Priority Data

Oct. 18, 2011 (JP) .................................. 2011-229055
Aug. 3, 2012 (JP) .................................. 2012-173011

(51) Int. Cl.
H03H 9/25 (2006.01)
H03H 9/64 (2006.01)
H03H 9/02 (2006.01)

(52) U.S. Cl.
CPC ....... *H03H 9/02559* (2013.01); *H03H 9/02574* (2013.01)

(58) Field of Classification Search
CPC ..................... H03H 9/02559; H03H 9/02574
USPC .......... 333/133, 193–196; 310/313 A, 313 B, 310/313 D, 357
See application file for complete search history.

(56) References Cited

U.S. PATENT DOCUMENTS

| 6,037,847 A * | 3/2000 | Ueda et al. ..................... 333/193 |
| 7,009,325 B2 * | 3/2006 | Kando et al. .............. 310/313 A |
| 7,692,515 B2 * | 4/2010 | Hauser et al. ................. 333/133 |

FOREIGN PATENT DOCUMENTS

| JP | 63-238708 | 10/1988 |
| JP | 09-167936 | 6/1997 |
| JP | 2003-283298 | 10/2003 |
| JP | 2006-087145 | 3/2006 |
| JP | 2007-074754 | 3/2007 |
| JP | 2012-142735 | 7/2012 |
| WO | 2008/004408 | 1/2008 |

OTHER PUBLICATIONS

Hashimoto et al., Optimum Leaky-SAW Cut of LiTaO3 for Minimised Insertion Loss Device, 1997 IEEE Ultrasonics Symposium Proceedings, Oct. 1997, pp. 245-254, vol. 1.

Naumenko et al., Optimized Cut of LiTaO3 for Resonator Filters with Improved Performance, 2002 IEEE Ultrasonics Symposium Proceedings, Oct. 2002, pp. 385-390, vol. 1.

* cited by examiner

*Primary Examiner* — Benny Lee
*Assistant Examiner* — Albens Dieujuste
(74) *Attorney, Agent, or Firm* — Jianq Chyun IP Office

(57) ABSTRACT

Disclosed is a surface acoustic wave device which has IDT electrodes arranged over a lithium tantalate piezoelectric substrate and is capable of suppressing propagation losses even at a high frequency band equal to or higher than 2 GHz as low as possible in order to utilize surface acoustic waves including LSAW. For this purpose, 45° to 46° rotated YX-cut lithium tantalate substrate is used as the piezoelectric substrate, a thickness of the IDT electrode is set to 7.5% λ to 8% λ, and a metallization ratio in electrode fingers of the IDT electrode is set to 0.55 to 0.65.

4 Claims, 19 Drawing Sheets

SURFACE ACOUSTIC WAVE DEVICE AND ELECTRONIC COMPONENT

CROSS-REFERENCE TO RELATED APPLICATION

This application claims the priority benefit of Japan application serial no. 2011-229055, filed on Oct. 18, 2011, and Japan application serial no. 2012-173011, filed on Aug. 3, 2012. The entirety of each of the above-mentioned patent applications is hereby incorporated by reference herein and made a part of specification.

TECHNICAL FIELD

The present invention relates to a surface acoustic wave device utilizing a leaky surface acoustic wave (LSAW) and an electronic component having the surface acoustic wave device.

DESCRIPTION OF THE RELATED ART

A YX-cut lithium tantalate ($LiTaO_3$) substrate (in which a surface acoustic wave propagates along an X-axis direction on a lithium tantalate substrate cut perpendicularly to a Y-axis rotated by a certain angle around a crystal X-axis) is employed as a representative piezoelectric substrate of the surface acoustic wave device using a leaky surface acoustic wave (LSAW) out of surface acoustic waves (SAW). The surface acoustic wave device includes an inter-digital transducer (IDT) electrode having, for example, a pair of busbars and electrode fingers arranged between the busbars and a resonator having reflectors formed in both sides along a propagation direction of the surface acoustic wave in the IDT electrode.

Bulk acoustic waves (BAW) propagating along the X-axis direction through the piezoelectric substrate include a slow transverse wave having a relatively slow propagation velocity (3349 m/s), a fast transverse wave having a propagation velocity (4214 m/s) faster than that of the slow transverse wave, and a longitudinal wave (5588 m/s) as illustrated in FIG. 19. In such a piezoelectric substrate, the fast transverse wave serves as a shear horizontal (SH) wave (which is a transverse wave having a displacement direction parallel to the surface of the piezoelectric substrate) and is concentrated on the surface of the piezoelectric substrate so as to serve as the LSAW described above. This LSAW is not a perfect SH wave and also has a shear vertical (SV) component.

In this case, when the LSAW propagates on the piezoelectric substrate, a propagation loss is generated. Such a propagation loss is generated because the LSAW has a propagation velocity faster than that of the SV bulk acoustic wave (slow transverse wave) as described above, and the SV component in the LSAW is combined with the SV bulk acoustic wave and propagates together so as to generate energy losses.

Here, an analysis was made for a case where the number of electrode finger pairs is set to be infinite (infinite periodic IDT) for propagation losses of the LSAW as described below. However, an analysis was not performed for an actual finite structure. In addition, although the cut angle of the piezoelectric substrate, the thickness of the IDT electrode, or the like are variously described in Japanese Unexamined Patent Application Nos. H9-167936, 2003-283298, 2006-87145, 2007-74754, and S63-238708 and PCT Pamphlet No. 2008-4408, they fail to discuss the propagation loss in the LSAW in detail.

[Patent Literature 1] Japanese Unexamined Patent Application No. H9-167936
[Patent Literature 2] PCT Pamphlet No. 2008-4408
[Patent Literature 3] Japanese Unexamined Patent Application No. 2003-283298
[Patent Literature 4] Japanese Unexamined Patent Application No. 2006-87145
[Patent Literature 5] Japanese Unexamined Patent Application No. 2007-74754
[Patent Literature 6] Japanese Unexamined Patent Application No. S63-238708

SUMMARY

The present invention has been made in view of the aforementioned problems, and an aim thereof is to provide a surface acoustic wave device which has an IDT electrode arranged over a lithium tantalate substrate and is capable of suppressing propagation losses even at a high frequency band equal to or higher than 2 GHz as low as possible in order to utilize surface acoustic waves including LSAW, and an electronic component.

According to an aspect of the present invention, there is provided a surface acoustic wave device utilizing surface acoustic waves including the LSAW having a frequency equal to or higher than 2 GHz, the surface acoustic wave including: a piezoelectric substrate configured such that a surface acoustic wave propagates along an X-axis direction on a lithium tantalate substrate cut perpendicularly to a Y-axis rotated by 45° to 46° around a crystal X-axis;

an IDT electrode including a pair of busbars, each of which extends along a propagation direction of a surface acoustic wave, and is made of a conductor film formed over the piezoelectric substrate in parallel with each other, and electrode fingers made of a conductive film and arranged to intersect each other in a comb-tooth shape from one of the busbars to the opposite busbar;

and a reflector having a pair of reflector busbars formed over the piezoelectric substrate in parallel with each other, each of which is provided in one side and the other side of the IDT electrode in a propagation direction of a surface acoustic wave and extends along a propagation direction of a surface acoustic wave, and reflector electrode fingers formed to connect the reflector busbars to each other, wherein a thickness of the conductor film in each of the electrode fingers is set to 7.5% to 8% of a periodic length ($\lambda$) of the electrode fingers, and a metallization ratio expressed as a value obtained by dividing a width D of the electrode finger by a sum of the width D of the electrode finger and an interval S between the neighboring electrode fingers is set to 0.55 to 0.65.

In the surface acoustic wave device, it is preferable that the metallization ratio be set to 0.55 to 0.60 in order to suppress a frequency change against a change of the metallization ratio. Meanwhile, it is preferable that the metallization ratio be set to 0.60 to 0.65 in order to increase a difference between a resonance frequency and an anti-resonance frequency. That is, in a case where a bandpass filter includes the surface acoustic wave device, the metallization ratio of a main IDT electrode is set to 0.60 to 0.65, so that the passband can be most easily widened.

According to another aspect of the present invention, there is provided an electronic component having the aforementioned surface acoustic wave device.

According to the present invention, in the surface acoustic wave device utilizing surface acoustic waves including LSAW having a frequency equal to or higher than 2 GHz, a 45° to 46° rotated YX-cut lithium tantalate substrate is used as the piezoelectric substrate. In addition, the thickness of electrode fingers in the IDT electrode is set to 7.5% λ to 8% λ (λ: periodic length of electrode fingers), and the metallization ratio of electrode fingers in the IDT electrode is set to 0.55 to 0.65. For this reason, it is possible to suppress a deviation of the frequency characteristic caused by a manufacturing variation and suppress propagation losses of the surface acoustic wave as low as possible.

DETAILED DESCRIPTION

<Overview of Surface Acoustic Wave Device>

Figure 1:
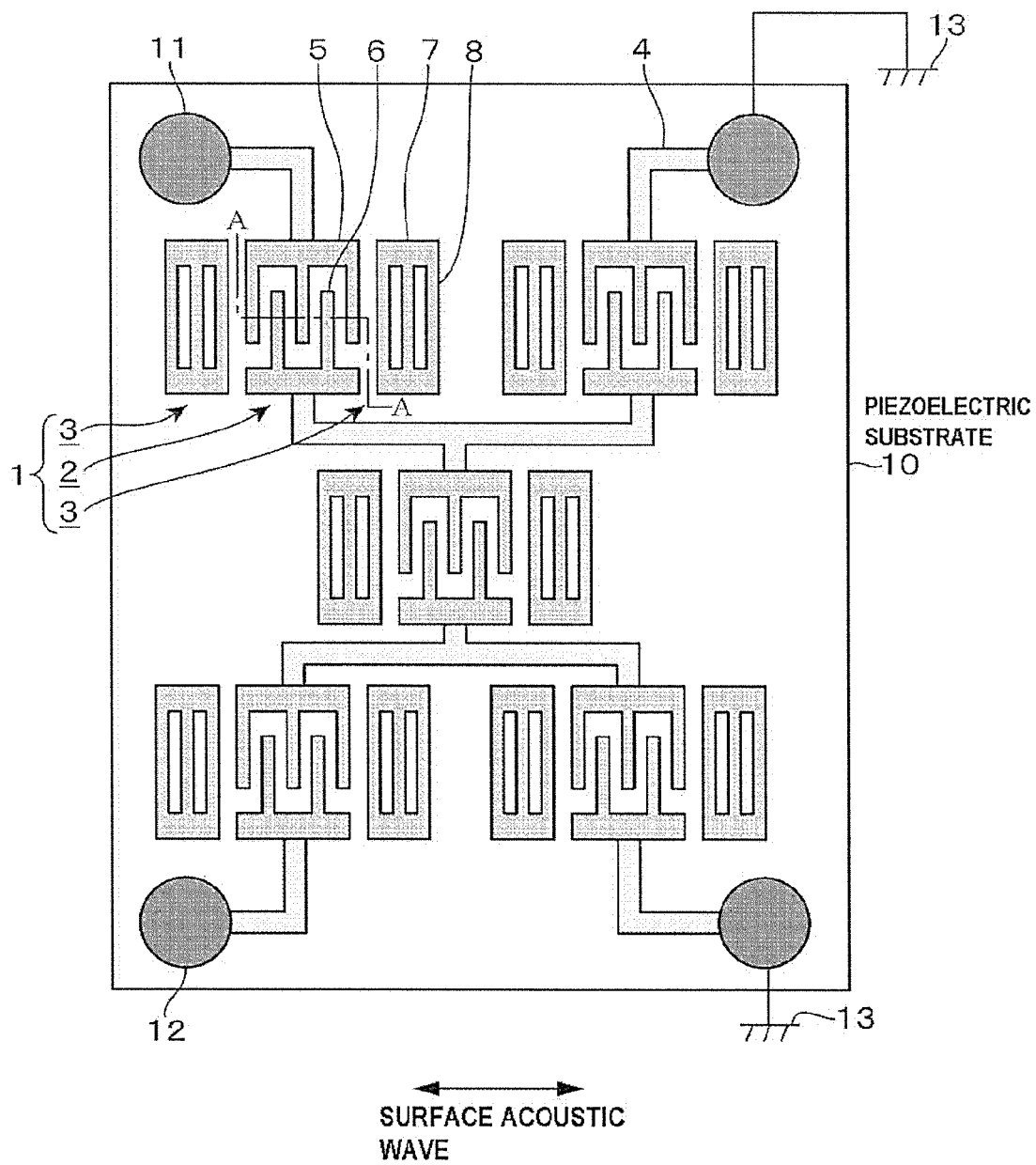
FIG. 1 is a top plan view illustrating an example of the surface acoustic wave device according to the present invention.
Figure 2:
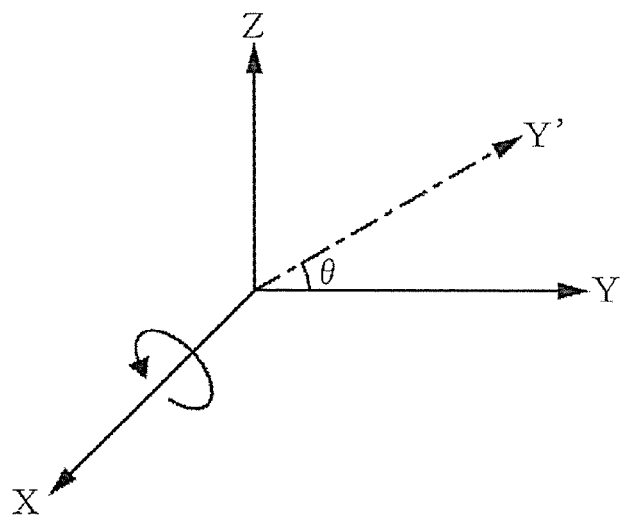
FIGS. 2A and 2B are explanatory diagrams illustrating a cut angle of a piezoelectric substrate of the surface acoustic wave device.
Figure 2:
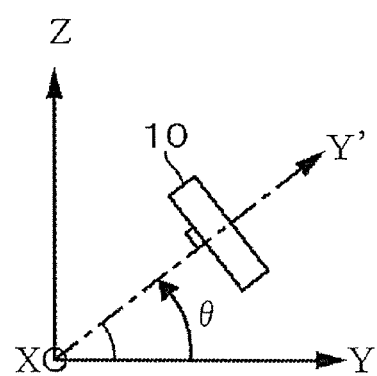

A surface acoustic wave device according to an exemplary embodiment of the present invention will be described with reference to FIGS. 1 to 3. First, before describing a reason why the surface acoustic wave device is configured as described below, an overview of the surface acoustic wave device will be described. The surface acoustic wave device is configured to utilize a leaky surface acoustic wave (LSAW) out of surface acoustic waves as illustrated in FIG. 1. In this example, a plurality of resonators 1 are formed over the piezoelectric substrate 10 and are electrically connected to each other in a ladder shape so as to provide a ladder-type bandpass filter. As schematically illustrated in FIGS. 2A and 2B, the piezoelectric substrate 10 includes a rotated YX-cut lithium tantalate substrate (in which a surface acoustic wave propagates along an X-axis direction on a lithium tantalate substrate cut perpendicularly to a Y-axis rotated by an angle θ around a crystal X-axis). The angle θ is set to 45° to 46°, specifically, 46°. Note that the same SAW characteristic can be obtained even when the piezoelectric substrate 10 has an inversely rotated angle θ just because the front and back sides of the piezoelectric substrate 10 are exchanged in this case.

In this example, three resonators 1 are connected to each other in series between an input port 11 and an output port 12 to provide a series arm, and a single resonator 1 between these resonator 1 is connected in parallel to provide a parallel arm. FIG. 1 illustrates a ground port 13 and an extraction electrode 4 for electrically connecting each of the resonator 1 or electrically connecting the resonator 1 and each port 11, 12, and 13. Note that each resonator 1 in FIG. 1 is schematically illustrated in simplification.

Each resonator 1 includes an IDT electrode 2 and reflectors 3 formed in one side and the other side of the IDT electrode 2 in a propagation direction of the surface acoustic wave (LSAW). The IDT electrode 2 includes a pair of busbar 5 that extend along the propagation direction of the surface acoustic wave and are arranged in parallel with each other and a plurality of electrode fingers 6 formed in a comb-tooth shape so as to intersect each other between the busbar 5. In this example, the IDT electrode 2 is a conventional electrode in which an electrode finger 6 extending from one of a pair of the busbar 5 and the neighboring electrode finger 6 extending from the other busbar 5 are alternately arranged along the propagation direction of the surface acoustic wave. In FIG. 1, illustrates a reflector busbar 7 and reflector electrode fingers 8.

Figure 3:
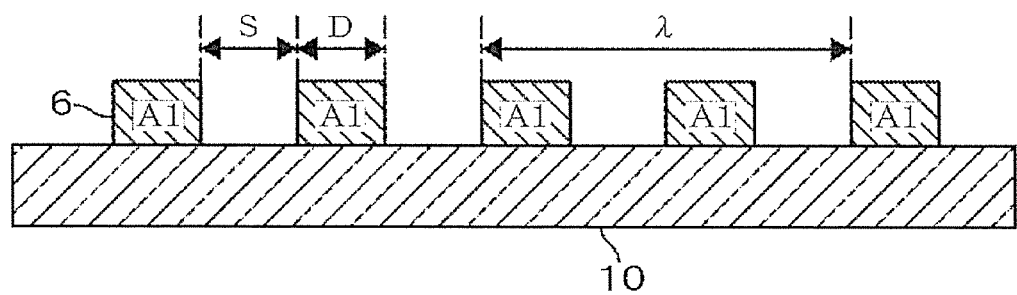
FIG. 3 is a longitudinal cross-sectional view illustrating the surface acoustic wave device.

As illustrated in FIG. 3, each electrode finger 6 is configured such that a periodic length λ including each width of two neighboring electrode fingers 6 and an interval between the electrode fingers 6 corresponds to a frequency of the surface acoustic wave propagating on the piezoelectric substrate 10. Specifically, the periodic length λ is set to a dimension equal to a wavelength λ of the surface acoustic wave at a desired frequency. According to the present embodiment, the periodic length λ is set such that LSAW having a resonance frequency f equal to or higher than 2 GHz, in this example, 2.4 GHz propagates on the piezoelectric substrate 10. That is, since a propagation velocity V of LSAW propagating the arrangement area of the electrode fingers 6 on the piezoelectric substrate 10 becomes, for example, 3877 m/s, the periodic length λ is set based on the equation f=V/λ. Specifically, the periodic length λ is set to 1.62 μm. Note that FIG. 3 is a longitudinal cross-sectional view taken along a line A-A of FIG. 1, and the thickness of the piezoelectric substrate 10 is schematically illustrated.

Here, assuming that the width of the electrode finger 6 and the interval between neighboring electrode fingers 6 are set to D and S, a metallization ratio r expressed as a value obtained by dividing the width D by a sum of the width D and the interval S becomes 0.55 to 0.65, in this example, 0.6 as in Equation 1 described below.

$$r = D \div (D+S) \tag{1}$$

As a specific dimension, the width D and the interval S are set to 0.486 μm and 0.324 μm, respectively. The number N of intersecting electrode fingers 6 (the number of electrode finger pairs 6) is set to, for example, 300, and the intersecting length W between the neighboring electrode fingers 6 and 6 is set to, for example, 37.5λ.

As illustrated in FIG. 3, each electrode finger 6 is made of, for example, an aluminum (Al) film as a conductor film. Specifically, each resonator 1 is formed, for example, by stacking an aluminum film and a resist film on the piezoelectric substrate 10 from the downside in this order and then performing a patterning through photolithography, etching, and the like. The thickness h of the electrode finger 6 is set to, for example, 7.5% λ to 8% λ, in this example, 8% λ of the periodic length λ. Hereinafter, a reason why the surface acoustic wave device is configured in this manner will be described.

<Cause of Energy Loss in Surface Acoustic Waves Obtained Until Now>

Since the LSAW includes an SV component as described in paragraphs of the Background, the SV component is combined with the SV bulk acoustic waves other than the LSAW so as to generate a propagation loss when it propagates on the piezoelectric substrate 10 described above. Therefore, if the SV component of the LSAW is accurately zero, the SV bulk acoustic wave radiation is removed, so that the propagation loss becomes zero. A condition that the propagation loss becomes zero in this manner is determined based on the combination of the thickness and width of the electrode finger 6, the cut angle of the piezoelectric substrate 10, and organization of the frequency bands of the surface acoustic wave device. For this reason, the surface acoustic wave device has a low loss by setting each parameter to schematically satisfy the aforementioned condition. Specifically, according to Technical Document 1, in a case where the thickness h of the electrode finger 6 and the metallization ratio r are set to 8% λ and 0.5, respectively, the 42° Y-cut substrate has a propagation loss of zero at a resonance frequency of the resonator 1 (lower end of the stopband). In addition, according to Technical Document 2, in a case where the thickness h and the metallization ratio r are set to 10% λ and 0.5, respectively, the 48° Y-cut substrate has a minimized average propagation loss from the resonance frequency to the anti-resonance frequency.

However, the analysis of Technical Documents 1 and 2 is based on assumption that the number of electrode fingers 6 is infinite (infinite periodic IDT), and it results from an ideal resonator having no end in the propagation direction of the surface acoustic wave. Meanwhile, since an actual resonator 1 has a finite number of electrode fingers 6, it is necessary to consider losses other than the SV bulk acoustic wave loss described above. In this regard, according to the present invention, as described below, a consideration is made for losses other than the SV bulk acoustic wave loss and a condition that the loss of LSAW is reduced as low as possible was analyzed.

<Losses Other than SV Bulk Acoustic Wave Loss>

Figure 4:
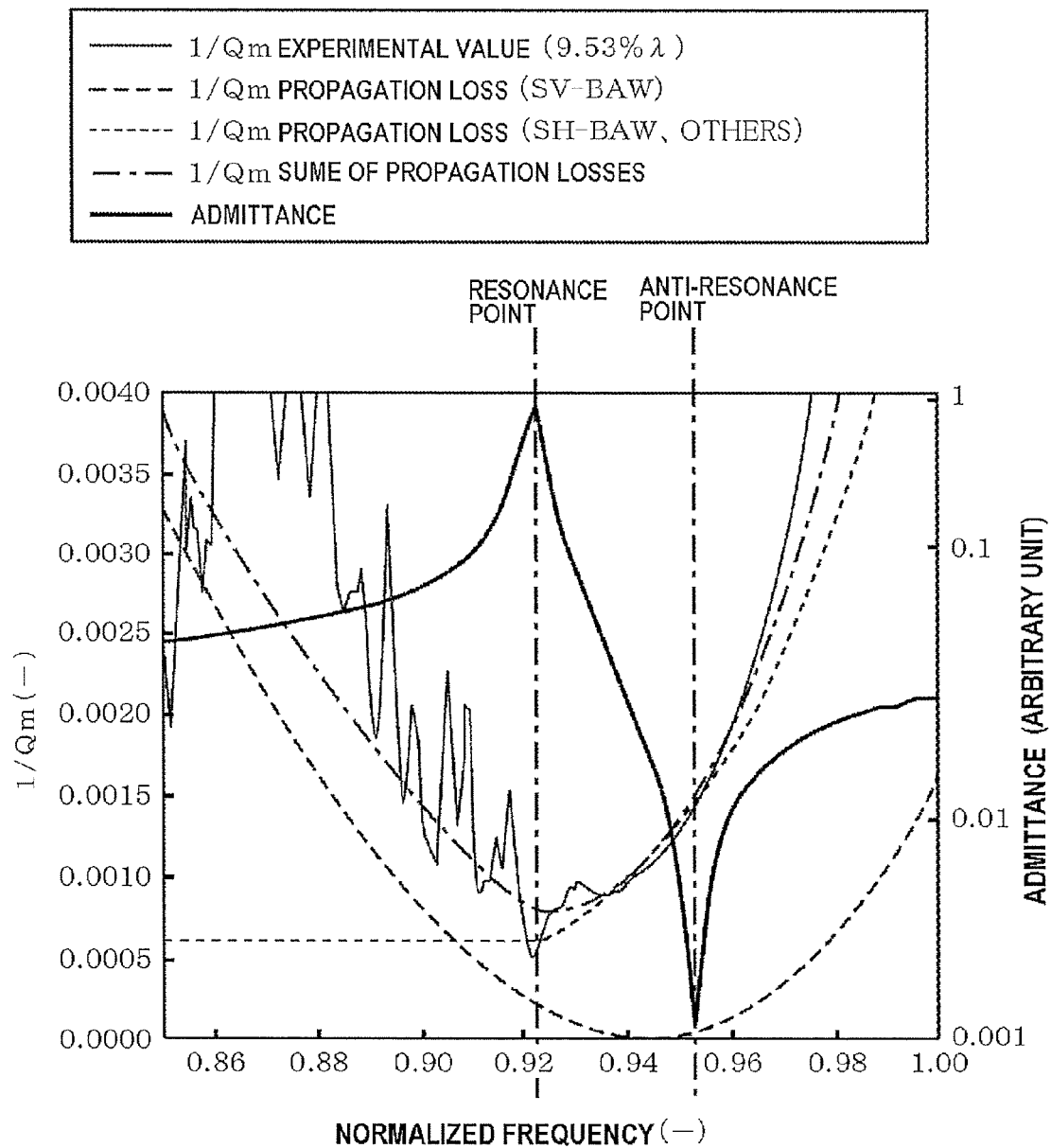
FIG. 4 is a characteristic diagram obtained by the surface acoustic wave device.

FIG. 4 illustrates a characteristic expressed as 1/Q (Q: Q value of resonance) of the mechanical loss amount obtained through actual measurement of the resonator described below. In FIG. 4, the abscissa denotes a Bragg frequency (approximately, 2107 MHz) in consideration of a propagation velocity (4212 m/s) of a transverse wave having a fast propagation velocity out of two transverse waves, that is, a frequency normalized using a cut-off frequency of the fast transverse wave. In FIG. 4, only the mechanical loss 1/Qm is considered excluding the ohmic loss caused by resistance of the electrode fingers. Note that the loss means a ratio of energy disappeared per unit time (against total energy), which is dimensionless.

(Resonator Used in Measurement)
piezoelectric substrate: 48° YX-cut lithium tantalate
periodic length (λ): 2 μm
number of electrode finger pairs (N): 250
number of reflector electrode fingers: 50, respectively
thickness of resonator: 9.53% λ

In FIG. 4, the solid line expressed as "measurement value" denotes an actual measurement value. It shows that the loss is minimized at the resonance point (resonance frequency) of the resonator and increases as a frequency approaches the anti-resonance point (anti-resonance frequency) from the resonance point.

One-port resonators having different measurement parameters such as the cut angle of the piezoelectric substrate, the thickness of the resonator, the metallization ratio of the IDT electrode, a dimension between busbars in the IDT electrode (opening length), and the number of electrode finger pairs (N) were manufactured in practice, and resonance characteristics of the resonators were measured using a high-frequency probe and a network analyzer. Based on this measurement result, an experimental formula for expressing the loss was computed. Specifically, a resonance characteristic (resonance circle in terms of a reflection characteristic) is obtained through the aforementioned measurement. The resonance characteristic is subjected to a fitting process using a lumped parameter equivalent circuit (i.e., a simplified circuit including an inductance (L), a capacitance (C), and a resistance (R)) to determine the constant. In this case, it is determined that the resistance RM of the series arm resonator indicating the mechanical loss changes depending on the frequency, and the frequency characteristic of the loss is obtained as $1/Qm = RM(\omega)/\omega L$.

The ohmic loss is expressed as a series resistance RE of the entire circuit and is separated. Therefore, the mechanical loss obtained as 1/Qm means a loss generated by leakage of waves due to any reason and is classified as follows:

(1) bulk acoustic wave radiation in substrate
(2) SAW leaking without being closed within reflector in propagation direction
(3) leakage in horizontal direction (opening length direction), and
(4) loss of energy disappeared due to viscosity of electrode.

In this case, for item (2), due to a sufficient reflection amount and a sufficient length of the reflector, the loss is seldom generated in the vicinity of the concerned resonance characteristic. For item (3), discussion is made for a condition that influence is negligible by focusing on data with a sufficient opening length. For item (4), discussion is made for a condition equal to or lower than an absolute frequency where influence becomes significant. In this manner, this experiment focuses on a condition that item (1) becomes a main factor for the mechanical loss. In addition, based on the result described above, the loss is evaluated by changing the aforementioned experimental parameters for the experimental formula. That is, since it is necessary to perform the analysis by assuming several hundreds of electrode fingers in order to know a SH–BAW loss through simulation, the analysis range becomes large, which makes the analysis difficult. Meanwhile, if an approximation formula based on the experimental result is used in this manner, evaluation can be made by freely setting the parameters.

Here, in FIG. 4, a propagation loss based on the SV–BAW theoretically determined using the techniques disclosed in Technical Documents 1 and 2 is expressed as "PROPAGATION LOSS (SV–BAW)," and a loss based on the aforementioned experimental formula is expressed as "PROPAGATION LOSS (SH–BAW), OTHERS." In addition, a sum of the two losses (SV+SH) are expressed as "SUM OF PROPAGATION LOSSES." The sum of losses exactly matches the result indicated by the "EXPERIMENTAL VALUE" in FIG.

4. Therefore, it is recognized that the parts other than "LOSS OF SV–BAW IN INFINITE PERIODIC STRUCTURE" which is the first loss are appropriately compensated by the experimental formula which expresses a second loss.

In summary, it was recognized that the propagation loss in LSAW includes the first loss and the second loss, the first loss relates to the SV–BAW loss as a theoretical value, and the second loss is a value obtained from the experimental formula and mainly relates to SH–BAW. Therefore, while the loss of item (1) is a mixture of SV–BAW and SH–BAW, SV–BAW is obtained from theoretical analysis of an ideal infinite periodic structure. As a result, it is possible to model (approximate) the loss of SH–BAW caused by the finite structure by subtracting the loss of item (1) from the experimental result.

Here, when a resonant device such as a filter or a duplexer is configured, it is preferable that the propagation loss in a region between the resonance point and the anti-resonance point be small. In this regard, the propagation loss in this region will be discussed. For SV–BAW, as recognized from FIG. 4, the loss becomes exactly zero between the resonance point and the anti-resonance point. Therefore, it can be said that the resonator used in the aforementioned measurement has an optimal condition of the SV–BAW.

Meanwhile, for SH–BAW, since the resonator has a finite structure, a loss is generated even at a frequency equal to or lower than the cut-off frequency (normalized frequency: 1) of the fast transverse wave described above, and the loss increases as the frequency approaches the cut-off frequency from the resonance point. In the losses obtained through the experiment, the loss at the anti-resonance point is larger than the loss at the resonance point because the SH–BAW loss serves as a dominant factor.

Figure 5:
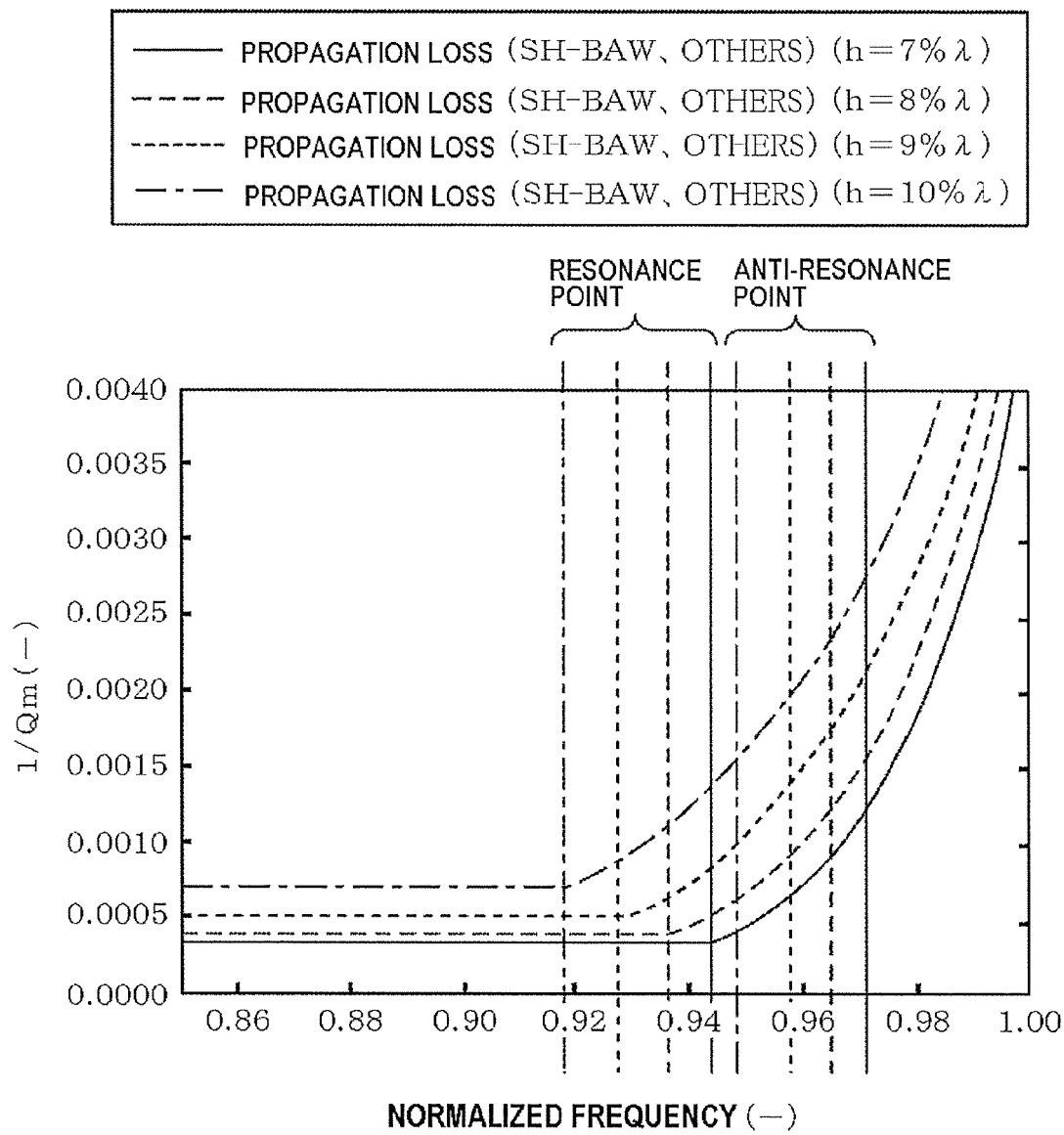
FIG. 5 is a characteristic diagram obtained by the surface acoustic wave device.

FIG. 5 illustrates a result of validating dependence of the thickness h of the resonator on the SH–BAW loss. FIG. 5 illustrates the SH–BAW loss when the thickness h is set to 7% $\lambda$, 8% $\lambda$, 9% $\lambda$, and 10% $\lambda$. The resonance points and the anti-resonance points at each condition are illustrated using the same line types as those used to indicate each of the losses. As a result, it is recognized that the SH–BAW loss at the anti-resonance point increases as the thickness increases. It is conceived that this is because SAW and BAW are easily combined as the thickness h increases at a frequency close to the cut-off frequency, so that conversion from SAW to BAW and radiation increases.

Figure 6:
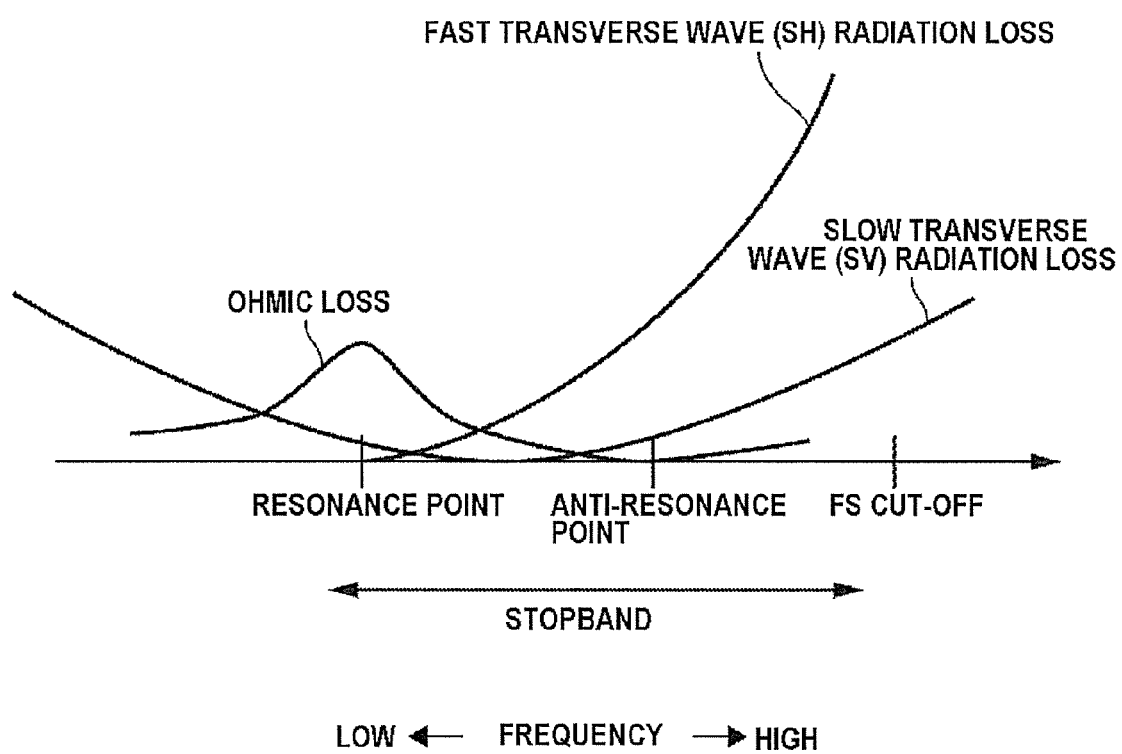
FIG. 6 is a schematic diagram illustrating characteristics obtained by the surface acoustic wave device.

However, in a case where a resonator is used at a high frequency band equal to or higher than 2 GHz, if the thickness h of the resonator is too small, the ohmic loss increases with respect to the resonance point. Therefore, it is preferable that the thickness be equal to or larger than 7% $\lambda$ (140 nm when $\lambda$=2 μm). In this regard, according to the present invention, in order to obtain a condition (parameter) to reduce the loss as low as possible, the lower limit of the thickness h is set to 7% $\lambda$. In this case, the ohmic loss varies depending on a frequency band (or periodic length $\lambda$) even when the thickness-wavelength ratio has the same condition. Therefore, it is not included in a target of optimization. Note that FIG. 6 schematically illustrates dependency of the loss on the frequency described above.

<Optimization of Each Parameter>

Figure 7:
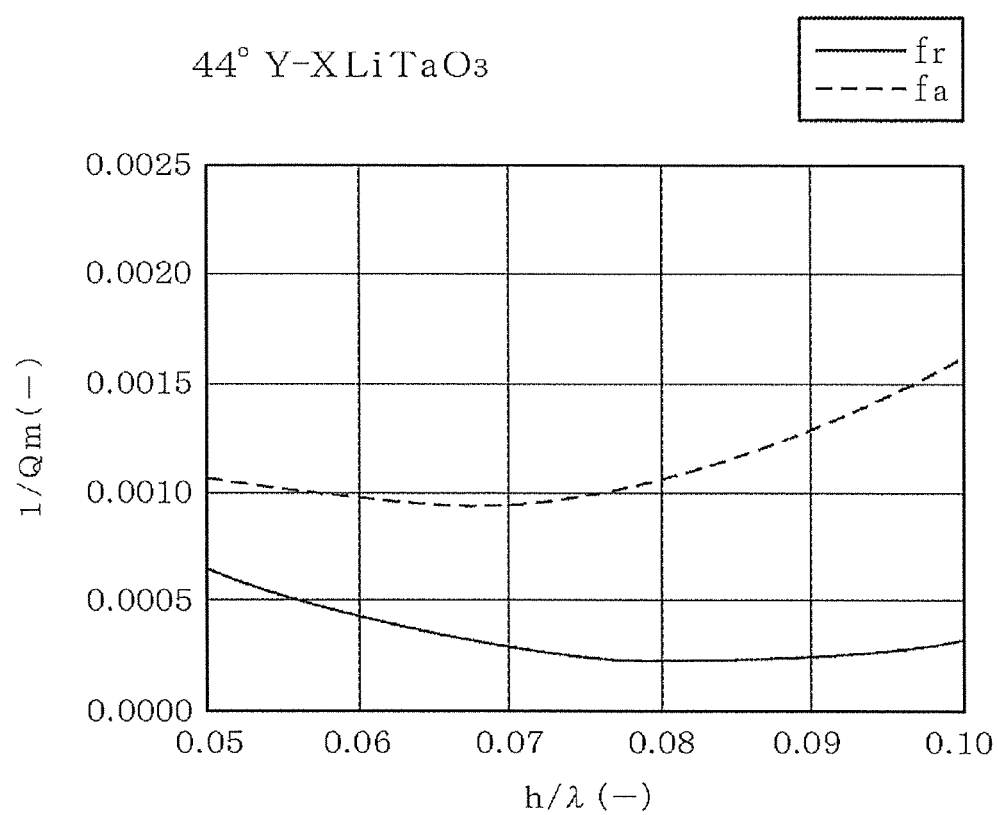
FIG. 7 is a characteristic diagram obtained by the surface acoustic wave device.
Figure 8:
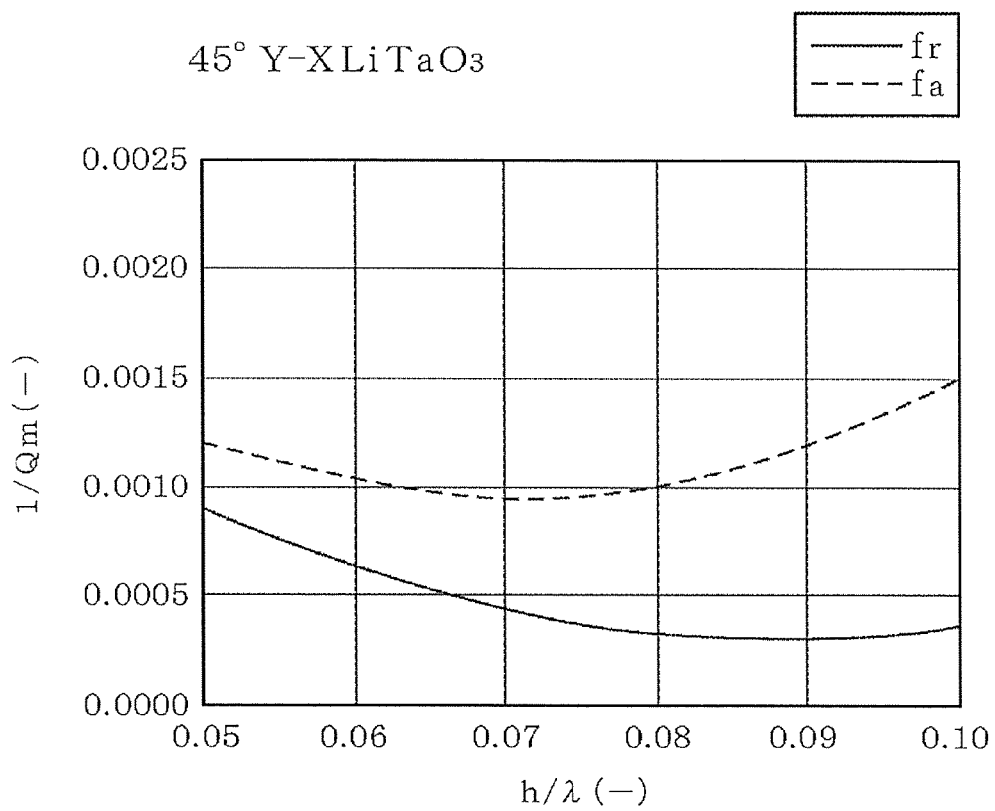
FIG. 8 is a characteristic diagram obtained by the surface acoustic wave device.
Figure 9:
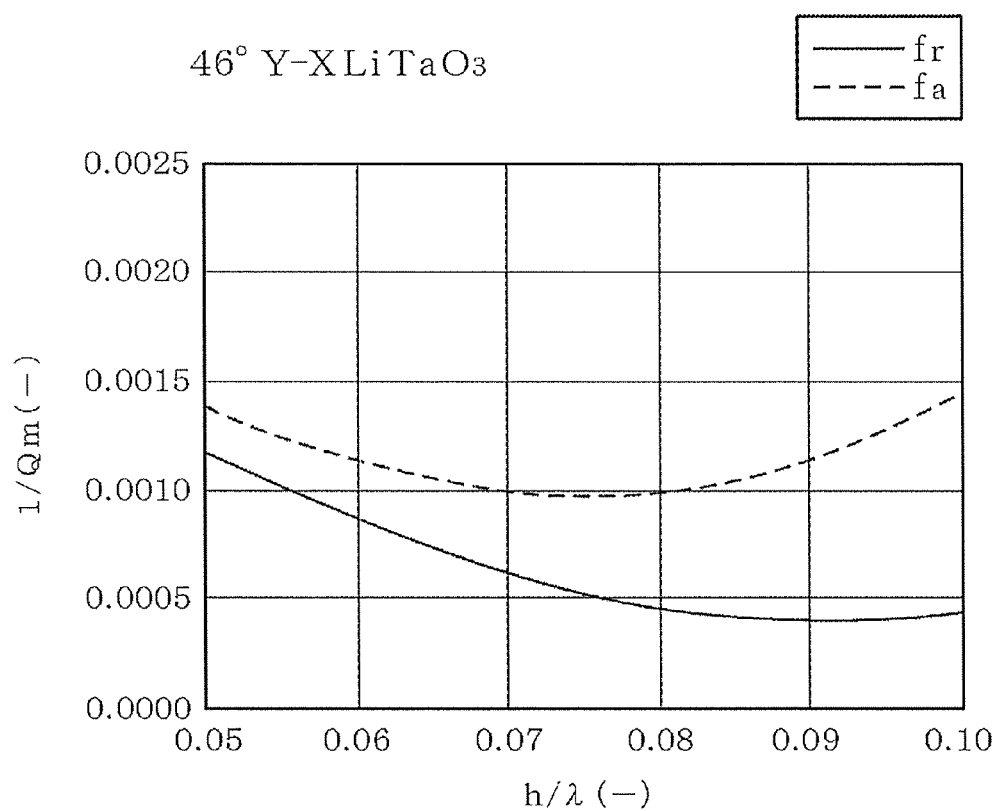
FIG. 9 is a characteristic diagram obtained by the surface acoustic wave device.
Figure 10:
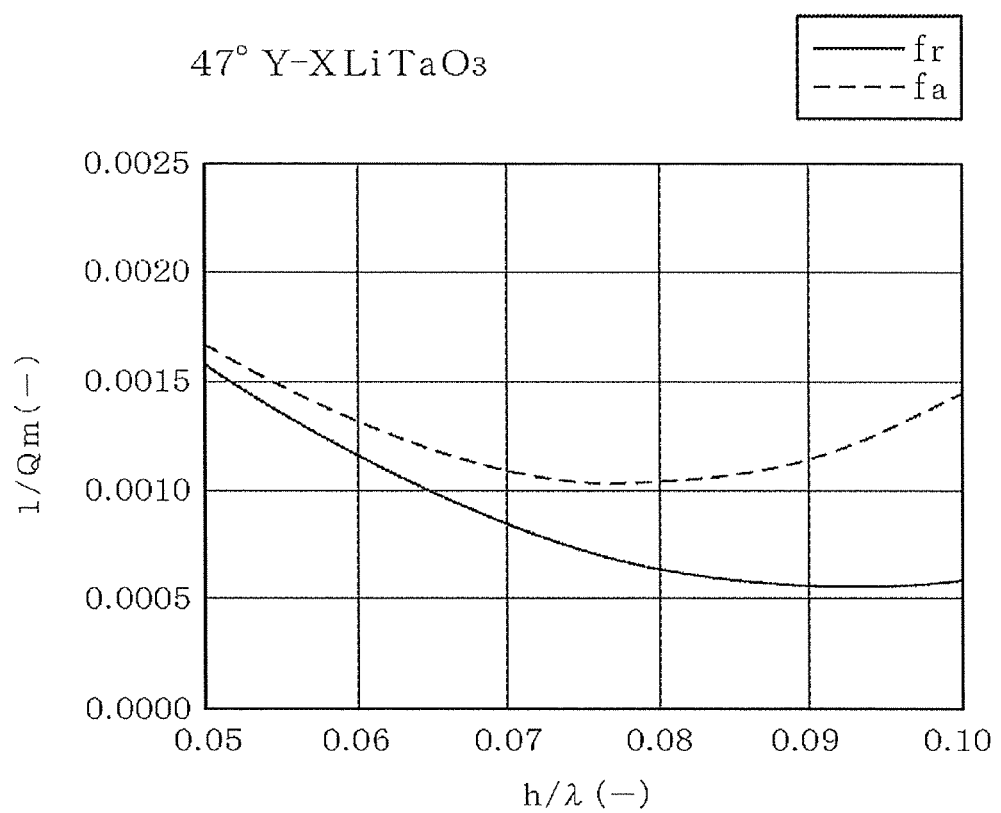
FIG. 10 is a characteristic diagram obtained by the surface acoustic wave device.
Figure 11:
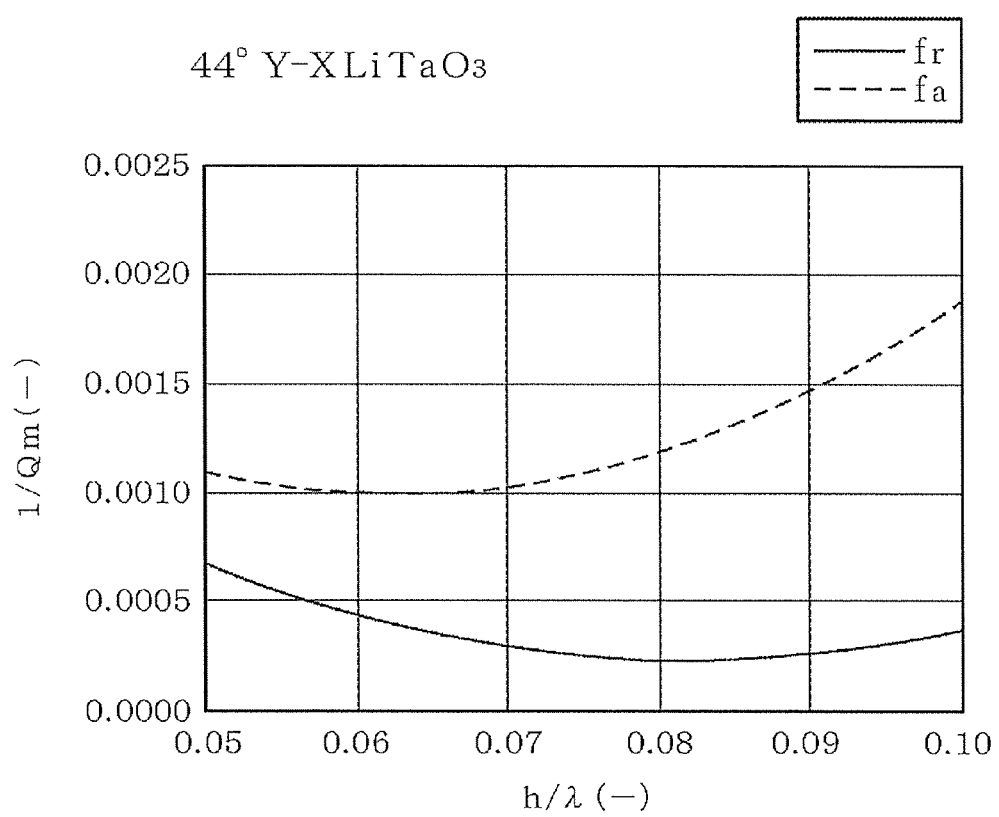
FIG. 11 is a characteristic diagram obtained by the surface acoustic wave device.
Figure 12:
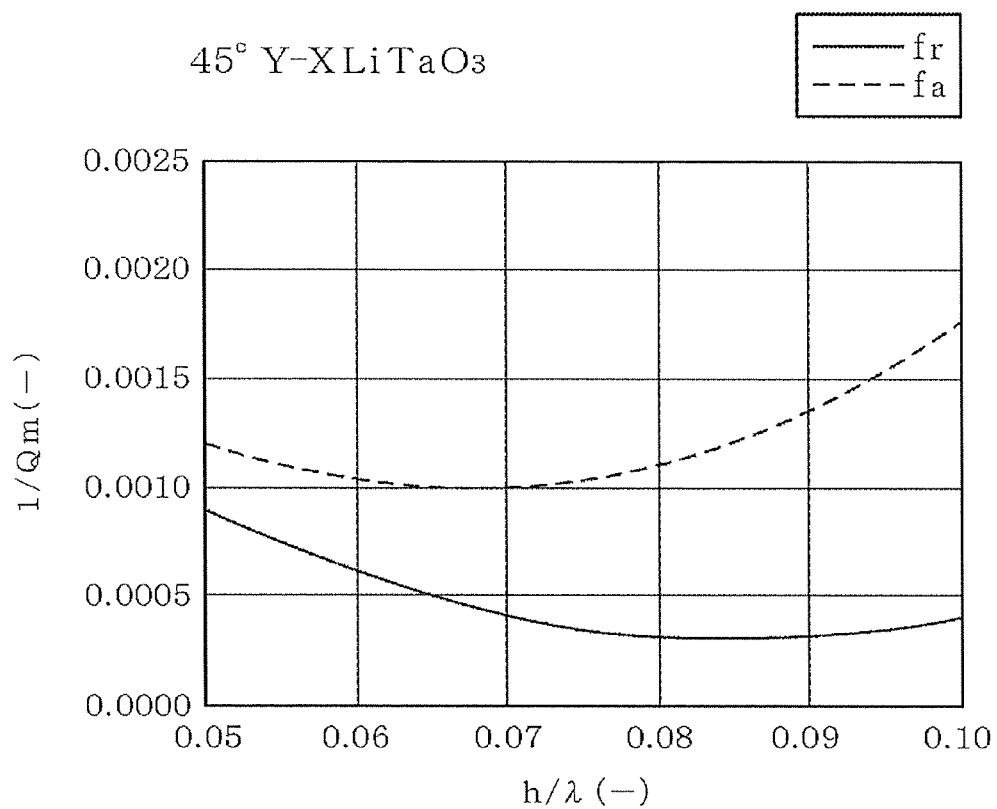
FIG. 12 is a characteristic diagram obtained by the surface acoustic wave device.
Figure 13:
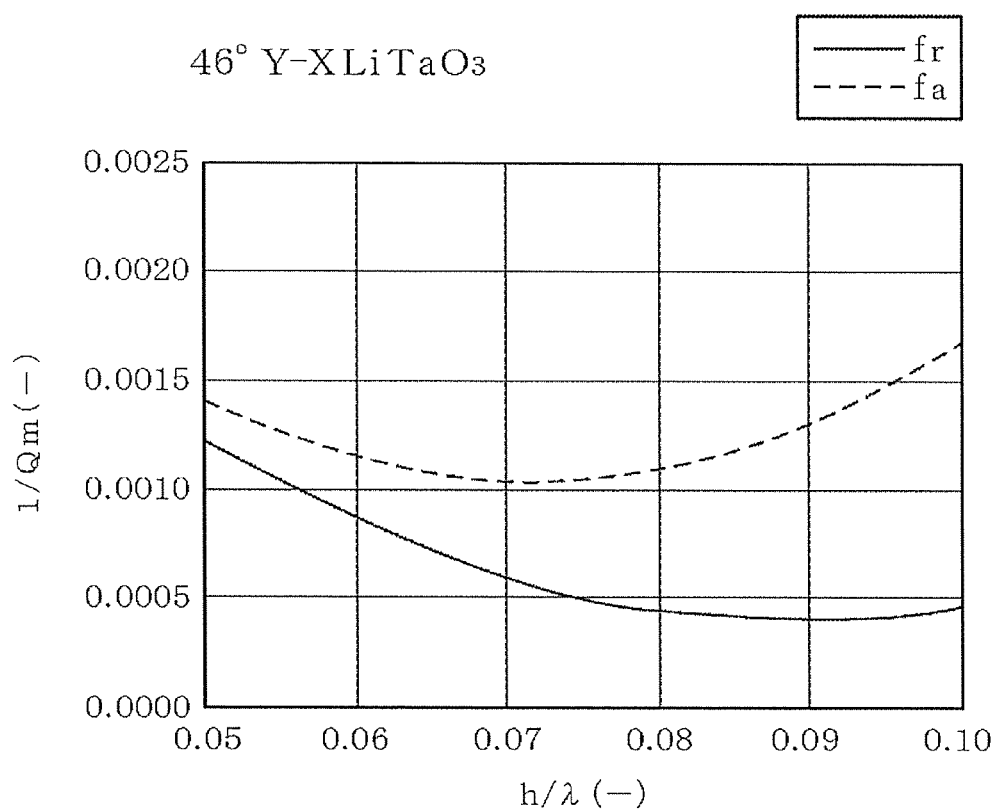
FIG. 13 is a characteristic diagram obtained by the surface acoustic wave device.
Figure 14:
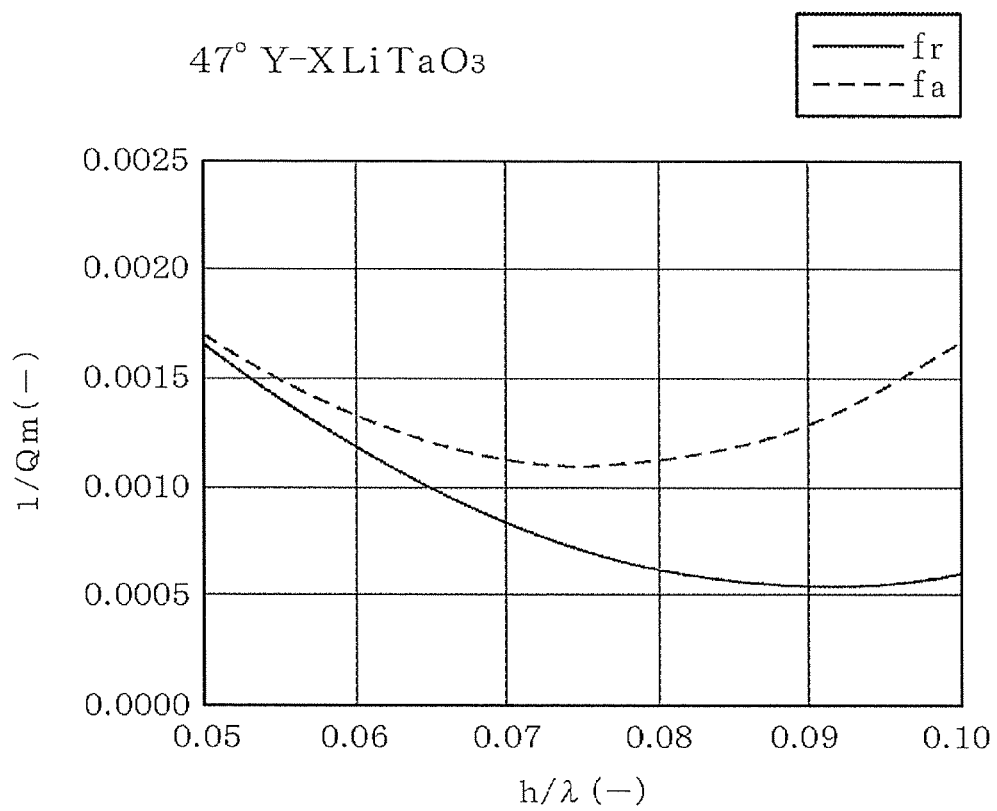
FIG. 14 is a characteristic diagram obtained by the surface acoustic wave device.

Subsequently, a computation result for optimal values of the thickness h, the cut angle, and the metallization ratio to reduce the losses as low as possible will be described. FIGS. 7 to 10 illustrate dependency of the loss on the thickness h at the resonance point (fr) and the anti-resonance point (fa) in a case where the metallization ratio r is set to 0.5, respectively. FIG. 7 illustrates a result of the case where the cut angle is set to 44°, and FIG. 8 illustrates a result of the case where the cut angle is set to 45°. FIGS. 9 and 10 illustrate results of the cases where the cut angle is set to 46° and 47°, respectively. In FIGS. 7 to 10, the abscissa denotes a thickness-wavelength ratio (h/$\lambda$) instead of the thickness h. In this simulation, the number N of electrode finger pairs and the opening length are set to 300 and 37.5$\lambda$, respectively.

As illustrated in FIGS. 7 to 10, the loss at either the resonance point or the anti-resonance point has a curve that decreases as the thickness-wavelength ratio increases (thickened) from, approximately, 0.05 and then increases as the thickness-wavelength ratio approaches 0.10. In addition, the thickness-wavelength ratio when the losses at the resonance point and the anti-resonance point are minimized is smaller (thinned) than 7% in a case where the cut angle is set to 44° (FIG. 7). Therefore, it is recognized that an optimal cut angle when the resonator is used at a high frequency band equal to or higher than 2 GHz is equal to or larger than 45° (44° is not appropriate).

Meanwhile, in a case where the cut angle is set to 45° (FIGS. 8) and 46° (FIG. 9), the thickness-wavelength ratio when the losses at the resonance point and the anti-resonance point are minimized is ranged between 0.075 and 0.08 (between 7.5% and 8%). This range corresponds to a region where influence of the ohmic loss is small in a high frequency band equal to or higher than 2 GHz. In a case where the cut angle is set to 47° (FIG. 10), the losses at the resonance point and the anti-resonance point increase compared to FIGS. 7 to 9. Therefore, it is recognized that, in a case where the metallization ratio r is set to 0.5, optimal values of the cut angle and the thickness-wavelength ratio are 45° to 46° and 7.5% to 8%, respectively.

Computation was made similarly by changing the cut angle and the thickness-wavelength ratio for a case where the metallization ratio r is set to 0.6. As illustrated in FIGS. 11 to 14, optimal values of the cut angle and the thickness-wavelength ratio are 45° to 46° and 7.5% to 8%, respectively.

Then, an optimal value of the metallization ratio r was reviewed. In the surface acoustic wave device using LSAW at a high frequency band equal to or higher than 2 GHz, the width of the electrode finger, the interval between neighboring electrode fingers, and the like are significantly reduced. Therefore, it is difficult to manufacture the surface acoustic wave device, and a deviation of the frequency characteristic is easily generated due to a dimension variation during manufacturing. In this regard, it is preferable that dependency of the metallization ratio r on the frequency characteristic be lowered. That is, it is preferable that the frequency characteristic not be changed due to a dimension error caused by a manufacturing variation when the surface acoustic wave device is manufactured. In this regard, a relationship between the metallization ratio r, the resonance point, and the anti-resonance point was similarly reviewed using the experimental formula as described below.

Figure 15:
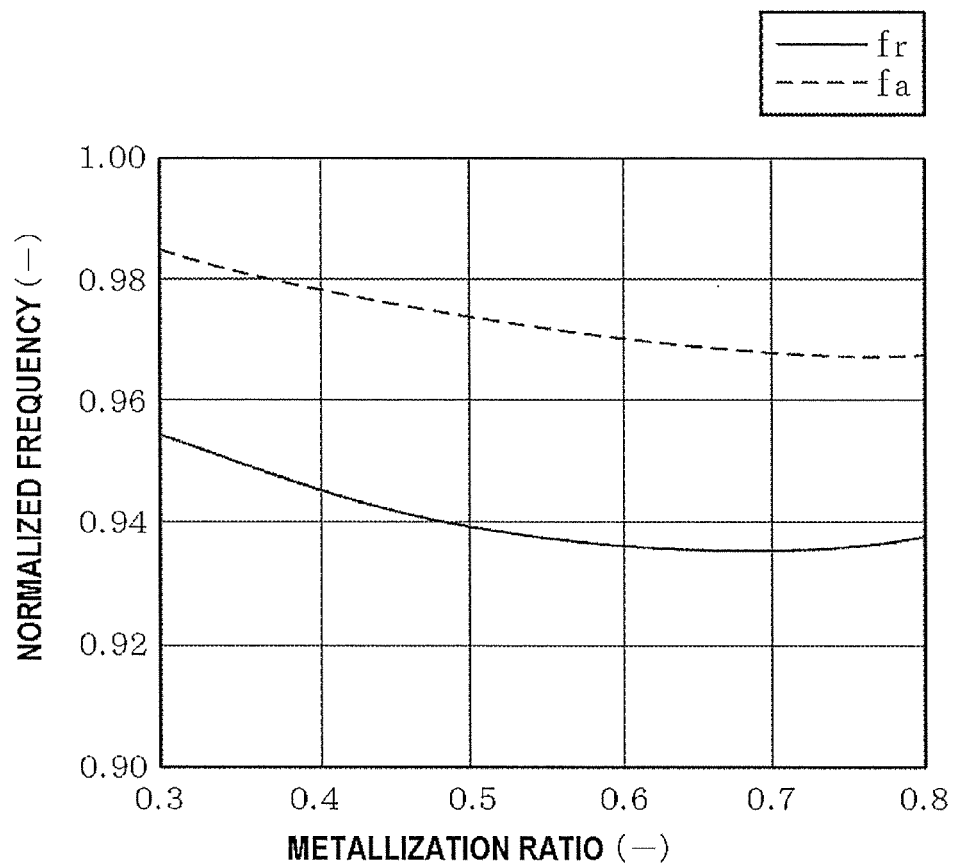
FIG. 15 is a characteristic diagram obtained by the surface acoustic wave device.

FIG. 15 illustrates dependency of the metallization ratio r on the resonance point and the anti-resonance point when the 45° YX-cut lithium tantalate substrate is used, and the thickness h is set to 7.5% $\lambda$. As recognized from FIG. 15, the resonance point is not significantly changed when the metallization ratio r is ranged between approximately 0.5 and approximately 0.7. Therefore, it can be said that it is preferable that the metallization ratio r be within this range. Note that other conditions are similar to those described above.

Figure 16:
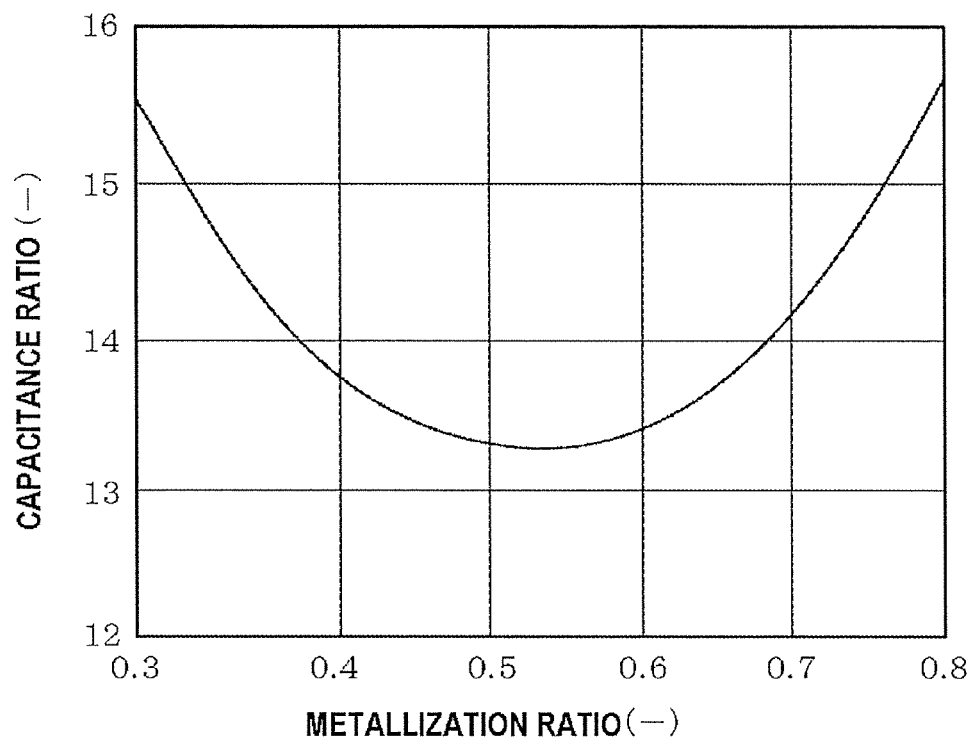
FIG. 16 is a characteristic diagram obtained by the surface acoustic wave device.

Here, FIG. 16 is a graph illustrating a relationship between the capacitance ratio of the resonator and the metallization ratio r. The "capacitance ratio" refers to a ratio between an original electrostatic capacitance C0 of the resonator and a capacitance C1 indicating a piezoelectric property of the resonator when the resonator is seen from the view point of an equivalent circuit. As the capacitance ratio decreases, a difference between the resonance point and the anti-resonance point increases, so that a wideband filter can be obtained. Meanwhile, as the capacitance ratio increases, a narrowband filter can be obtained. In addition, since a wideband filter having a significantly wide band is necessary in the surface acoustic wave device in many cases, it is preferable that the capacitance ratio be set as small as possible. Therefore, in FIG. 16, the capacitance ratio is set as small as possible. Meanwhile, in FIG. 15, the metallization ratio r when a frequency change range at the resonance point is minimized as small as possible is set to 0.55 to 0.65. An optimal range of the metallization ratio r is not nearly changed in a region where the cut angle is set to 45° to 46°, and the thickness h is set to 7.5% λ to 8% λ. In addition, if the number of electrode finger pairs and the opening length are not extremely small, that is, if the number of electrode finger pairs is set to, approximately, 100 or greater, and the opening length is set to, approximately, 12λ or larger, the optimal condition described above is not nearly influenced although the loss amount may be changed.

Figure 17:
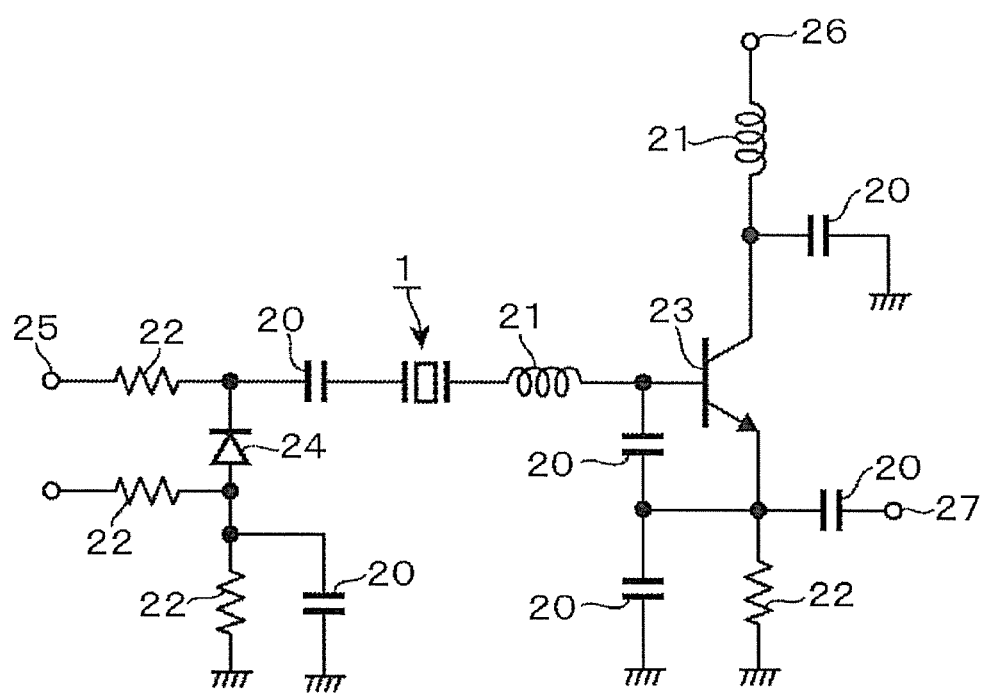
FIG. 17 is a circuit diagram illustrating another example of the surface acoustic wave device.

Furthermore, it is possible to obtain an optimal characteristic suitable for each specification by setting the metallization ratio r depending on a target characteristic (specification). Specifically, it is preferable that the metallization ratio r be set to 0.55 to 0.60 in order to obtain a characteristic having a small frequency change against a change of the metallization ratio r. Meanwhile, in a case where it is necessary to provide the surface acoustic wave device with a small capacitance ratio and a large difference between the resonance point and the anti-resonance point, it is preferable that the metallization ratio r be set to 0.60 to 0.65. That is, in a case where a wideband bandpass filter is obtained by increasing the passband when a filter having a passband and a stopband is provided as the surface acoustic wave device, it is preferable that the metallization ratio r be set to 0.60 to 0.65. In addition, in a case where a wideband surface acoustic wave device is provided by setting the metallization ratio r to 0.60 to 0.65, the surface acoustic wave device is applied to a voltage controlled oscillator (VCO) to increase a variable width of the frequency in the VCO. An example of such a VCO is illustrated in FIG. 17. This VCO employs a configuration using a Colpitts circuit obtained by combining a capacitor 20, an inductor 21, a resistor 22, a transistor 23, and a diode 24, and the resonator 1 described above is interposed between a base terminal of the transistor 23 and an input terminal 25. Referring to FIG. 17, illustrated are a port 26 where a voltage for driving the transistor 23 is applied and an output port 27.

According to the embodiment described above, in the surface acoustic wave device utilizing surface acoustic waves including LSAW having a frequency equal to or higher than 2 GHz, a 45° to 46° rotated YX-cut lithium tantalate substrate is used as the piezoelectric substrate 10. In addition, the thickness h of the IDT electrode 2 is set to 7.5% λ to 8% λ, and the metallization ratio r for electrode fingers 6 in the IDT electrode 2 is set to 0.55 to 0.65. For this reason, it is possible to suppress a deviation of the frequency characteristic caused by a manufacturing variation and suppress a propagation loss in LSAW. In addition, since the capacitance ratio of the surface acoustic wave device can be reduced as described above, it is possible to provide a wideband filter by increasing the difference between the resonance point and the anti-resonance point.

In the related art, an analysis for reviewing frequency characteristics of overall mechanical losses comprehensively and specifying an optimal condition in consideration of the metallization ratio r was not performed. However, according to the present invention, as described above, the SH–BAW loss is also considered in addition to the SV–BAW loss, an experimental formula expressing the SH–BAW loss is created, and the cut angle, the thickness h, and the metallization ratio r of the piezoelectric substrate 10 are optimized based on this experimental formula. Therefore, it is possible to obtain an optimal realistic condition in the surface acoustic wave device such as an actual resonator which employs a finite structure. In addition, the metallization ratio r which was used as a parameter for adjusting, for example, a propagation velocity, a reflectance of the electrode finger, and the like in the related art is set such that the loss is minimized as low as possible, a change of the resonance point caused by a manufacturing variation is suppressed, and the parameters are adjusted to provide a wideband filter. Therefore, it is possible to obtain a surface acoustic wave device capable of suppressing losses as described above.

For this reason, the aforementioned surface acoustic wave device is preferably employed in an electronic component having a surface acoustic wave device.

Figure 18:
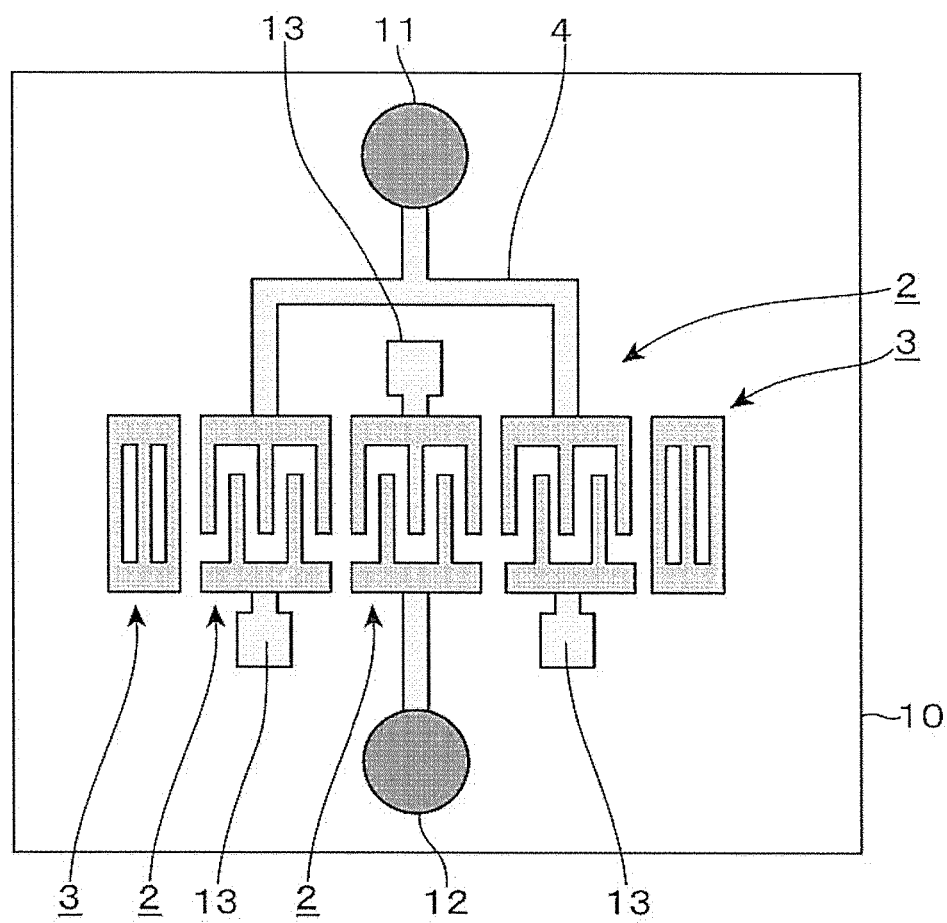
FIG. 18 is a top plan view illustrating another example of the surface acoustic wave device.
Figure 19:
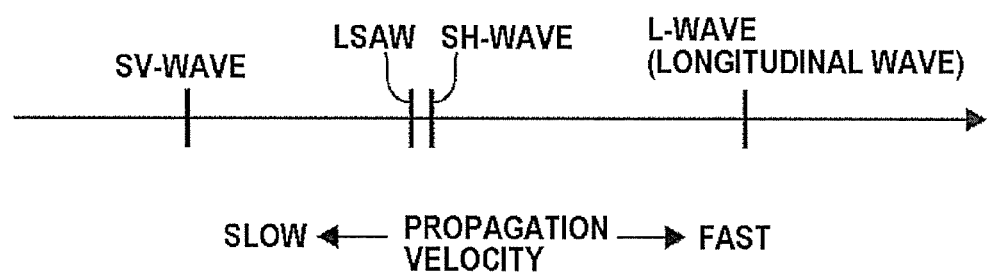
FIG. 19 is a schematic diagram illustrating a propagation velocity of the surface acoustic wave.

Although a ladder-type filter using the resonator 1 has been exemplarily described as the aforementioned surface acoustic wave device, a vertical resonator type filter may be employed as illustrated in FIG. 18. In FIG. 18, a plurality of IDT electrodes 2, for example, three IDT electrodes 2 are arranged over the piezoelectric substrate 10 along the propagation direction of the surface acoustic wave, and a reflector 3 is arranged in both sides of a line of the IDT electrodes 2 in the propagation direction. In addition, although the thickness h of the electrode finger 6 is set to, for example, 7.5% λ to 8% λ, the thickness of the busbar 5 may be set independently from the electrode finger 6.

[Technical Document 1] Ken-ya Hashimoto et al, "Optimum Leaky-SAW Cut of LiTaO3 for Minimised Insertion Loss Devices," Proc. 1997 IEEE Ultrason. Symp., pp. 245-254

[Technical Document 2] Natalya Naumenko and Benjamin Abbotto, "Optimized Cut of LiTaO3 for Resonator Filters with Improved Performance" Proc. 2002 IEEE Ultrason. Symp., pp. 385-390

What is claimed is:

1. A surface acoustic wave device utilizing surface acoustic waves including a leaky surface acoustic wave (LSAW) having a frequency equal to or higher than 2 GHz, the surface acoustic wave device comprising:
a piezoelectric substrate, configured such that the surface acoustic wave propagates along an X-axis direction on a lithium tantalate substrate cut perpendicularly to a Y-axis rotated by 45° to 46° around the crystal X-axis;
an IDT electrode, including:
a pair of busbars, each busbar extends along the propagation direction of the surface acoustic wave, and is made of a conductor film formed over the piezoelectric substrate in parallel with each other, and
electrode fingers, made of a conductive film and arranged to intersect each other in a comb-tooth shape from one of the busbars to the opposite busbar; and
a reflector, having:
a pair of reflector busbars, formed over the piezoelectric substrate in parallel with each other, each busbar is provided in one side and the other side of the IDT electrode in the propagation direction of the surface acoustic wave and extends along the propagation direction of the surface acoustic wave, and
reflector electrode fingers, formed to connect the reflector busbars to each other, wherein, a thickness of the conductor film in each of the electrode fingers is set to 7.5% λ to 8% λ, where λ denotes a periodic length of the IDT electrode fingers, and a metallization ratio expressed as a value obtained by dividing a width D of the IDT electrode finger by a sum of the width D of the electrode finger and an interval S between the neighboring IDT electrode fingers is set to 0.55 to 0.60 in order to suppress a frequency change against a change of the metallization ratio.

2. An electronic component, comprising:
the surface acoustic wave device according to claim 1.

3. A surface acoustic wave device utilizing surface acoustic waves including a leaky surface acoustic wave (LSAW) having a frequency equal to or higher than 2 GHz, the surface acoustic wave comprising:

a piezoelectric substrate, configured such that the surface acoustic wave propagates along an X-axis direction on a lithium tantalate substrate cut perpendicularly to a Y-axis rotated by 45° to 46° around the crystal X-axis;

an IDT electrode, including:
a pair of busbars, each busbar extends along the propagation direction of the surface acoustic wave, and is made of a conductor film formed over the piezoelectric substrate in parallel with each other, and electrode fingers, made of a conductive film and arranged to intersect each other in a comb-tooth shape from one of the busbars to the opposite busbar; and a reflector, having:
a pair of reflector busbars, formed over the piezoelectric substrate in parallel with each other, each busbar is provided in one side and the other side of the IDT electrode in the propagation direction of the surface acoustic wave and extends along the propagation direction of the surface acoustic wave, and reflector electrode fingers, formed to connect the reflector busbars to each other, wherein, a thickness of the conductor film in each of the electrode fingers is set to 7.5% λ to 8% λ where λ denotes a periodic length of the IDT electrode fingers, and a metallization ratio expressed as a value obtained by dividing a width D of the IDT electrode finger by a sum of the width D of the electrode finger and an interval S between the neighboring IDT electrode fingers is set to 0.60 to 0.65 in order to increase a difference between a resonance frequency and an anti-resonance frequency.

4. An electronic component, comprising:
the surface acoustic wave device according to claim 3.

* * * * *